United States Patent
Rutten et al.

(10) Patent No.: US 9,431,962 B2
(45) Date of Patent: Aug. 30, 2016

(54) COEFFICIENT ESTIMATION FOR DIGITAL IQ CALIBRATION

(71) Applicant: NXP B.V., Eindhoven (NL)

(72) Inventors: Robert Rutten, Uden (NL); Lucien Johannes Breems, Eindhoven (NL); Jan van Sinderen, Liempde (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/588,544

(22) Filed: Jan. 2, 2015

(65) Prior Publication Data
US 2015/0200628 A1 Jul. 16, 2015

(30) Foreign Application Priority Data
Jan. 10, 2014 (EP) .................................. 14150824

(51) Int. Cl.
| | |
|---|---|
| H04B 1/10 | (2006.01) |
| H03D 7/14 | (2006.01) |
| H04L 27/38 | (2006.01) |
| H04B 1/16 | (2006.01) |
| H03D 3/00 | (2006.01) |
| H04B 1/30 | (2006.01) |
| H04B 15/00 | (2006.01) |

(52) U.S. Cl.
CPC ............ *H03D 7/1466* (2013.01); *H03D 3/009* (2013.01); *H04B 1/16* (2013.01); *H04B 1/30* (2013.01); *H04L 27/3863* (2013.01); *H04B 2001/305* (2013.01)

(58) Field of Classification Search
CPC ......... H03D 3/009; H03D 7/18; H03D 7/165
USPC .................................................. 455/302, 306
See application file for complete search history.

(56) References Cited

U.S. PATENT DOCUMENTS

| | | | | |
|---|---|---|---|---|
| 6,330,290 B1 * | 12/2001 | Glas | ...................... | H03D 3/009 |
| | | | | 329/306 |
| 2007/0080835 A1 | 4/2007 | Maeda et al. | | |
| 2007/0202825 A1 | 8/2007 | Park et al. | | |
| 2009/0131006 A1 | 5/2009 | Wu | | |

FOREIGN PATENT DOCUMENTS

WO 2007/146090 A2 12/2007

OTHER PUBLICATIONS

Schoonen, A.; "Estimation Methods for IQ Imbalance in Multi-Standard (Near) Zero IF Receivers"; NXP Research; 134 pages (May 7, 2009).
Windisch, Marcus, et al; "Blind Estimation and Compensation of I/Q Impablance in OFDM Receivers with Enhancements Through Kalman Filtering"; Proceedings of the IEEE Workshop on Statistical Signal Procession, Madison, WI, USA (Aug. 2007).
Valkama, M., et al; "Advanced Methods for I/Q Imbalance Compensation in Communication Receiver"; IEEE Transaction on Signal Processing, vol. 49, No. 10; pp. 2335-2344 (Oct. 2001).
Extended European Search Report for application No. 14150824.2 (Jun. 23, 2014).

* cited by examiner

*Primary Examiner* — Lee Nguyen

(57) ABSTRACT

An RF reception system and method uses IF quadrature mixing, in which there is further mixing and channel filtering in the digital domain, to isolate a frequency of interest. A coefficient estimator is used for generating a phase correction coefficient and an amplitude correction coefficient from filtered in-phase and quadrature desired signals and from filtered in-phase and quadrature image signals.

14 Claims, 5 Drawing Sheets

COEFFICIENT ESTIMATION FOR DIGITAL IQ CALIBRATION

CROSS-REFERENCE TO RELATED APPLICATIONS

This application claims the priority under 35 U.S.C. §119 of European patent application no. 14150824.2, filed on Jan. 11, 2014, the contents of which are incorporated by reference herein.

This application relates to coefficient estimation for digital IQ calibration.

Receiver systems receiving relatively high frequency RF signals often make use of a so-called IQ system where the RF signal is mixed with a sine and cosine wave (so-called quadrature mixing), producing an I (In phase) and Q (Quadrature phase) signal.

This so called intermediate frequency (IF) signal is further processed by amplifiers, filters and ADC's (Analogue to Digital converters) when digital processing is preferred.

FIG. 1 shows a possible implementation of such a receiver system.

The receiver has an analogue front end 10 and a digital correction section 12. In the analogue section, the input RF signal is mixed with the intermediate frequency carriers, using mixers 14 to generate the I and Q components. These are filtered by filters 16, then amplified and converted to digital signals by analogue to digital converters 18. The output of the analogue to digital converters can contain more than one channel of interest. The channels are often located at different frequencies in the signal band that is converted by the converters. Further digital processing takes care of selecting the wanted channel and suppressing the unwanted channels The mixers, IF filters, amplifiers and converters all are analogue components, and they can produce an amplitude and phase error between the I and Q path.

The amplitude transfer function for the I branch should be identical to the amplitude transfer function for the Q branch, and the phase between both branches should be 90° for optimum Image Rejection (IR). If this is not the case, it leads to limited IR performance, in particular as a result of mixing of the desired signals with the so-called image band.

Methods have been proposed to improve the IR by applying a digital correction algorithm as shown in FIG. 1. These methods focus on calibrating frequency independent errors, where the amplitude error and phase error are assumed to be frequency independent.

The compensation system 12 shown in FIG. 1 provides a variable gain in the I path to provide relative gain adjustment, as well as an addition of a variable part of the Q path to the I path to provide phase adjustment.

The output of the analogue to digital converter, including only phase mismatch can be written as a sampled version of the signal:

$$ADC_{out} = A * \cos(wt+\phi) + j * A * \sin(wt)$$

Where A equals the modulated blocker signal, w the mixer frequency, t the time and $\phi$ the phase mismatch. The blocker signal is the signal located at the negative frequency space of the desired frequency space. It causes signal content at the desired band when IQ mismatch is present. The equation can be rewritten as:

$$ADC_{out} = A*(\cos(wt)*\cos(\phi)+\sin(wt)*\sin(\phi))+j*A*\sin(wt)$$

$\cos(\phi)$ and $\sin(\phi)$ are assumed to be constant or very slowly changing, since they represent the phase mismatch of the receiver. The term $\cos(wt)*\cos(\phi)$ equals almost $\cos(wt)$, since $\phi$ is assumed to be small. In any case, a deviation from $\cos(\phi)=1$ will be compensated by the amplitude correction.

The term $\sin(wt)*\sin(\phi)$ is the error and it can be corrected by subtracting a scaled part the Q path ($A*\sin(wt)$) with coefficient value $\sin(\phi)$.

Thus, the amplitude is corrected by the coefficient Amp coef which controls a variable amplifier 20, and the phase is corrected the coefficient Phase coef which controls the variable amplifier 22. An adder 23 adds (or subtracts if the amplification is negative) the amplified Q channel into the I channel. The coefficients are derived by a coefficient estimator 24. The resulting generated signals I' and Q' have an improved IR performance when the coefficients are set to the correct values. These signals are used by the coefficient estimator, so that a feedback control loop is implemented.

FIG. 2 shows a possible implementation of the coefficient estimator 24.

The phase coefficient is determined by integrating the correlation between the I' and Q' samples (multiplier 26 for performing the correlation, amplifier 28, integrator 30).

The amplitude difference is determined by integrating the difference between the absolute sample values of I' and Q' (magnitude units 31, adder 32, amplifier 34, integrator 36).

The outputs of the phase coefficient and amplitude difference are approximated by the following formulas. For these calculations, symmetrical phase and amplitude errors are applied in the formulas, to simplify the equations.

Let the intermediate frequency analogue to digital converter output be:

$$IF_{ADC} = (1+\Delta/2)*A*\cos(wt+\phi/2)+j*(1-\Delta/2)*A*\sin(wt-\phi/2) \qquad \text{Eq. 1}$$

Where $\Delta$ equals the amplitude difference between the I and Q branch, $\phi$ the phase difference. A is the modulated blocker signal, w is the modulation frequency.

The blocker signal is located at frequency w, and there is an unwanted image at frequency $-w$.

For the coefficient estimator of FIG. 2, the coefficients are obtained by subtracting the absolute values of the I and Q branch for the amplitude estimation, and multiplication of the I and Q branch to obtain the phase information. The integrators 36 and 30 suppress any high frequency content.

For the amplitude estimation the subtraction of the absolute value (D) equals:

$$D = |(1+\Delta/2)*A*\cos(wt+\phi/2)| - |(1-\Delta/2)*A*\sin(wt-\phi/2)|$$

The average value of the absolute value of a sin or cosine function equals $2/\pi$. The average value Davg for the amplitude estimation can be rewritten as $$Davg = |A|*\Delta*2/\pi$$

This is a measure for the amplitude mismatch which is used to determine the value of Amp coef.

For the phase estimation the multiplication of I and Q lead to signal P:

$$P = (1+\Delta/2)*A*\cos(wt+\phi/2)*(1-\Delta/2)*A*\sin(wt-\phi/2)$$

This can be rewritten as:

$$P = A^2*(1+\Delta/2)(1-\Delta/2)*(-\cos(\phi/2)*\sin(\phi/2)+\tfrac{1}{2}*\sin(2wt))$$

The compensation method usually compensates small amplitude and phase deviation. As such assumption $\cos(\phi/2) \sim 1$ and $\sin(\phi/2) \sim \phi/2$ can be made to simplify the results. To calculate the average phase detector value (Pavg), sin (2wt) is approximated to be 0. Pavg can be estimated by:

$$Pavg \approx -\tfrac{1}{2}*A^2*\phi*(1-\tfrac{1}{4}*\Delta^2)$$

This is a measure for the phase mismatch which is used to determine the value of Phase coef. The gain of Pavg weakly depends on the amplitude mismatch Δ, but this mismatch Δ is assumed to be much smaller than 1, and thus will not have a large influence on the strength of the phase indicator.

The gains in the estimation path determine the speed and accuracy of the coefficient tracking in the calibration system. As long as the coefficients are the same as a function of signal frequency, the IR performance is equal for the whole signal band.

When the optimum amplitude and phase coefficients are different at different signal frequency, the image rejection (IR) performance will be optimal for one frequency, and worse for the rest of the signal band. This is a problem for a wide-band system where multiple frequency locations are occupied with signal content. The coefficients might be optimized for one frequency, while another frequency is of interest.

FIG. 3 shows an example where a frequency dependent error is present in the signal band at the output of the analogue to digital converters. The frequency axis is scaled such that +0.5 equals Fs/2 and −0.5 equals Fs/2, where Fs equals the sample rate of the converters. At normalized frequency 0.1 and 0.3 strong blockers are present, leading to images at frequencies −0.1 and −0.3. The coefficients, found by the algorithm of FIG. 2 are optimized for frequency −0.1.

For this example, the wideband optimization of FIG. 1 is applied. The phase and amplitude formulas show that the blocker signal A is influencing the gain of the indicator signals. The outputs of the coefficient estimator will be determined mainly by the strongest signal in the signal band. For this example, the strongest signal is at 0.1 with its image at −0.1. The coefficients are optimized for +/−0.1, which means the coefficients are not optimal for +/−0.3 in this example.

The plot shows the uncompensated spectrum. The regions 40 show how the spectrum is altered by the compensation function. As shown, the peaks at −0.3 and −0.1 are reduced. The greater reduction is at −0.1 for which the coefficients are optimised.

When a small signal at frequency −0.3 is of interest (not shown in the figure), the coefficients are not optimal. This results in a poor IR of 43 dB in this example.

When only a small part of the spectrum is desired for further processing (e.g. the spectrum around −0.3), the ADC can be followed by a digital mixer and (decimation) filters. This mixer mixes the desired band to zero-IF and decimation filters isolate the desired signal and remove the rest.

The invention is defined by the claims.

According to an embodiment, there is provided an RF receiver, comprising:

a quadrature mixer which receives the RF input signal and which outputs in-phase and quadrature channels;

analogue to digital converters for the in-phase and quadrature channels;

an amplitude compensator for adjusting the amplitude of one or both of the channels to correct for amplitude mismatch, based on an amplitude correction coefficient;

a phase compensator for adjusting the relative phase between the two channels to correct for phase mismatch, based on a phase correction coefficient;

a first mixer generating in-phase and quadrature desired signals from the amplitude adjusted and phase adjusted channels by mixing with a first frequency, and a first digital channel filter at the output of the first mixer generating a filtered in-phase desired signal and a filtered quadrature desired signal;

a second mixer generating in-phase and quadrature image signals from the amplitude adjusted and phase adjusted channels by mixing with a second frequency, and a second digital channel filter at the output of the second mixer generating a filtered in-phase image signal and a filtered quadrature image signal;

a coefficient estimator for generating the phase correction coefficient and the amplitude correction coefficient from the filtered in-phase and quadrature desired signals and the filtered in-phase and quadrature image signals.

This receiver makes use of digital channel filtered outputs to optimise a digital correction of imperfections in the analogue quadrature mixing. The first and second mixing frequencies are to shift a desired channel of interest to baseband and the image of that desired channel of interest to baseband. In this way, a low pass-filter is sufficient to isolate the wanted channels from the unwanted channels.

In one example, the coefficient estimator comprises:

a third mixer for mixing the filtered in-phase and quadrature desired signals with a third frequency to generate shifted in-phase and quadrature desired signals;

a fourth mixer for mixing the filtered in-phase and quadrature image signals with a fourth frequency which is the negative of the first frequency to generate shifted in-phase and quadrature image signals; and an adder for combining the shifted in-phase and quadrature signals to generate a combined in-phase signal and a combined quadrature signal.

The added signal has clean desired and image IQ signals on opposite sides of zero frequency. The fourth frequency can be the analogue to digital converter sampling frequency divided by 4. This provides a particularly simple to implement mixing function, to reconstruct signals which can be used to derive the required correction coefficients.

The coefficient estimator can further comprise an amplitude coefficient circuit for obtaining an amplitude difference between the combined in-phase signal and the combined quadrature signal. This amplitude coefficient circuit can for example comprise an integrator for integrating the difference between samples of the combined in-phase signal and the combined quadrature signal.

The coefficient estimator can also further comprises a phase coefficient circuit for obtaining a phase difference between the combined in-phase signal and the combined quadrature signal. This phase coefficient circuit can comprise an integrator for integrating the correlation between samples of the combined in-phase signal and the combined quadrature signal.

In one arrangement, the amplitude compensator can comprise a variable gain amplifier in series with one of the channels, controlled by the amplitude correction coefficient. This introduces amplification to one of the I and Q channels. The phase compensator can comprise a variable gain amplifier and an adder, for adding an amplified (or attenuated) component of one channel to the other channel, with the variable gain amplifier of the phase compensator controlled by the phase correction coefficient.

The first and second digital channel filters can have an output oversampled by at least by a factor of 2.

Embodiments also provide an RF reception method, comprising:

quadrature mixing an RF input signal to generate in-phase and quadrature channels;

converting the in-phase and quadrature channels to digital;

adjusting the amplitude of one or both of the channels to correct for amplitude mismatch, based on an amplitude correction coefficient;

adjusting the relative phase between the two channels to correct for phase mismatch, based on a phase correction coefficient;

mixing and channel filtering the amplitude and phase adjusted channels to generate in-phase and quadrature desired signals, by mixing with a first frequency;

mixing and channel filtering the amplitude and phase adjusted channels to generate in-phase and quadrature image signals, by mixing with a second frequency; and generating the phase correction coefficient and the amplitude correction coefficient from the filtered in-phase and quadrature desired signals and the filtered in-phase and quadrature image signals.

BRIEF DESCRIPTION OF THE DRAWINGS

Examples will now be described in detail with reference to the accompanying drawings, in which.

DETAILED DESCRIPTION

Embodiments relate to RF reception systems using IF quadrature mixing, in which there is further mixing and channel filtering in the digital domain, to isolate a frequency of interest. A coefficient estimator is used for generating a phase correction coefficient and an amplitude correction coefficient from filtered in-phase and quadrature desired signals and from filtered in-phase and quadrature image signals.

Figure 1:
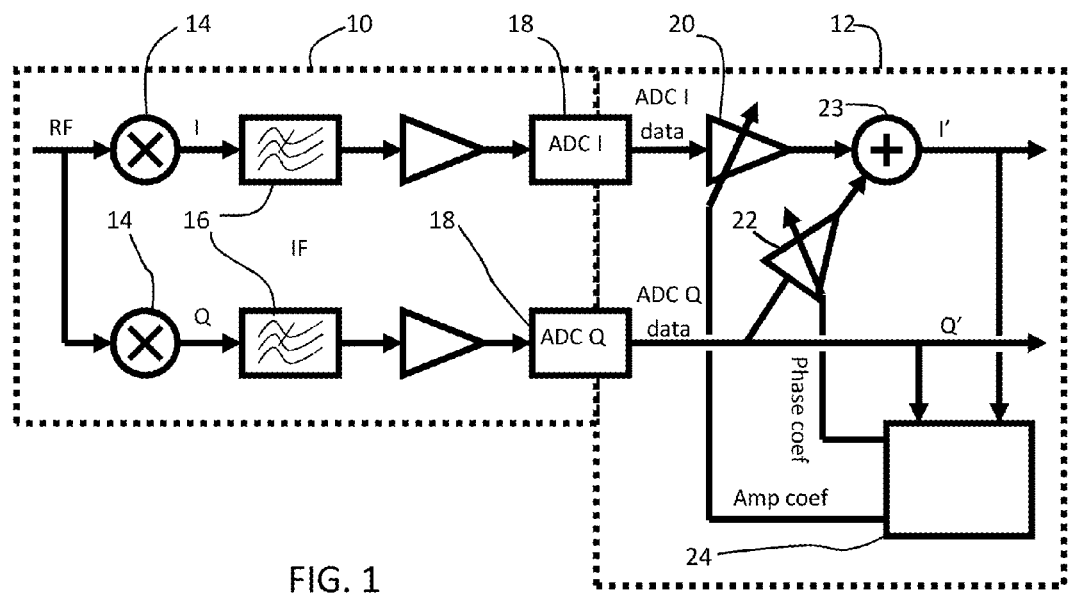
FIG. 1 shows a known RF receiver.
Figure 4:
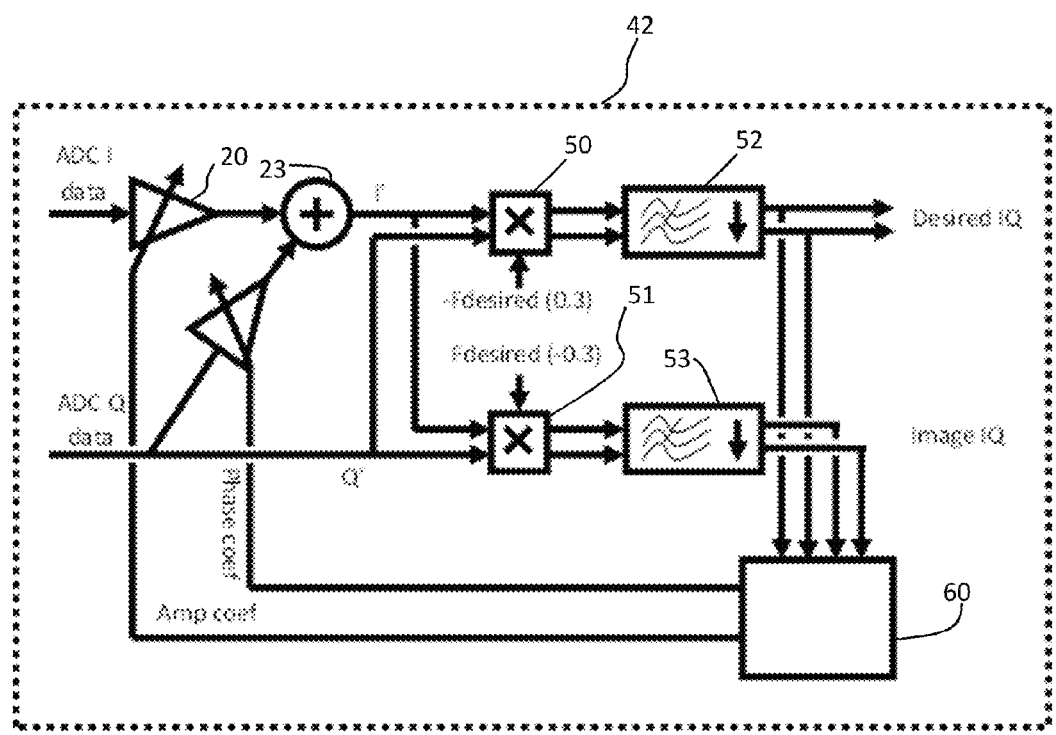
FIG. 4 shows an example of RF receiver.

FIG. 4 shows a modification to the digital correction part of FIG. 1 in accordance with an example to form digital part 42. A digital mixers 50 further process the I' channel and a digital mixer 51 further processes the Q' channel. Mixer 52 mixes the I' and Q' signals with the frequency of interest and mixer 50 mixes the I' and Q' signals with the negative of that frequency. In this way, desired IQ signals and image IQ signals are obtained.

The analogue to digital converters can receive multiple channels By way of example, the desired channel may be at a normalised frequency of −0.3. The signal content at for example the normalized frequency of 0.1 might be another channel which is of no interest for the receiver at this time.

To shift the desired channel to baseband, a frequency shift of +0.3 is conducted. To shift the image channel to baseband, a frequency shift of −0.3 is conducted.

Decimation filter 52 isolates the desired signal and decimation filter isolates the image signal. The outputs of the received desired signal and image signal are used for coefficient optimization.

A modified image rejection coefficient estimator is provided, shown as unit 60 in FIG. 4.

Figure 2:
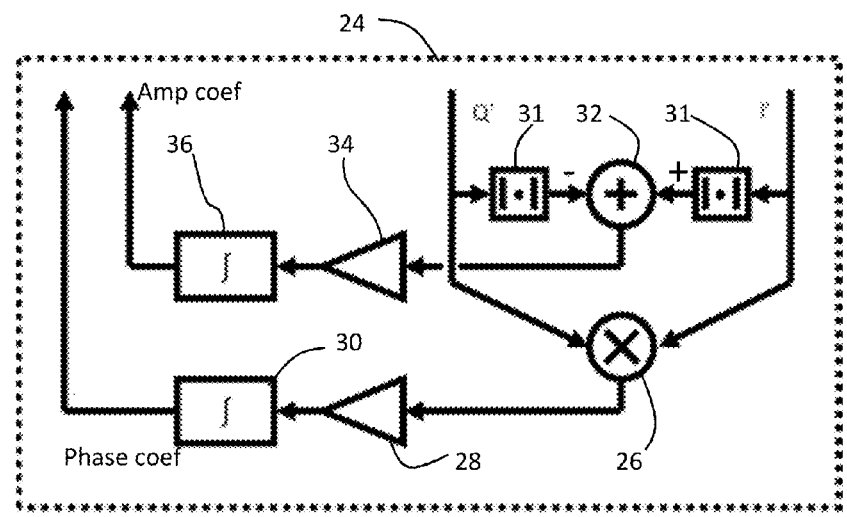
FIG. 2 shows an example of the coefficient estimator used in this circuit.

The coefficient estimator of FIG. 2 cannot be used since the number of inputs has doubled. Extracting phase and amplitude information is more difficult.

To solve this, the system is designed such that the outputs of the digital (decimation) filters 52, 53 of FIG. 4 are oversampled by at least a factor 2.

Figure 5:
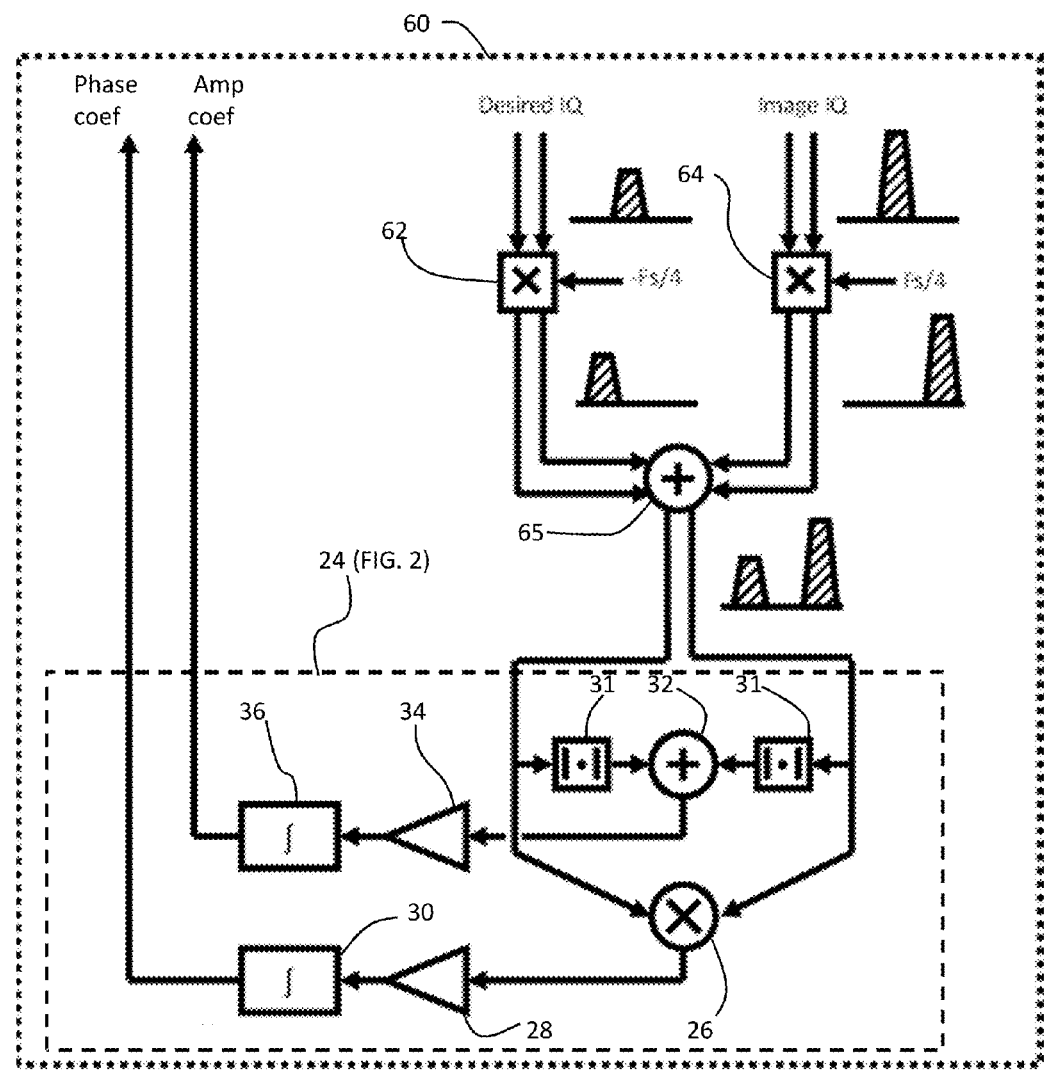
FIG. 5 shows the coefficient estimator in more detail.

FIG. 5 shows an example of the coefficient estimator 60.

The desired IQ signals and image IQ signals are input to the coefficient estimator 60. Both the desired and image signals contain an isolated signal around 0 Hz.

For reconstructing the original signal, the two signals should be mixed back to their original frequency location (at frequencies w and −w), but that would require more frequency shifters. Moreover, the sample frequency might be too low for this action since the digital filtering might include decimation.

The following formulas show what will happen if the two signals are frequency shifted to any arbitrary frequencies r and r for the image and desired signal respectively.

First, the desired signal is isolated from the rest of the spectrum in the analogue domain, as shown in FIG. 1 by frequency shifters 14 and filtering & decimating (filters 16). The intermediate frequency analogue to digital converter output around −w from Eq. 1 is frequency shifted by w to 0 Hz:

$$Desired_{BB}=IF_{ADC}*(\cos(wt)+j*\sin(wt))$$

Rewriting $Desired_{BB}$ and eliminating the high frequency content which is filtered by filters 16 leads to:

$$Desired_{BB\_LPF}=\Delta*A*\cos(\tfrac{1}{2}\phi)-j*A*\sin(\tfrac{1}{2}\phi)$$

This signal equals 0 when no IQ error is present. If $\Delta$ and/or $\phi$ is not zero, part of the blocker signal 'A' is received in the $Desired_{BB\_LPF}$ signal. This signal $Desired_{BB\_LPF}$ can directly be used for further processing when the wanted signal is present in the band. Note that the actual desired signal is not present in the equations to simplify them. Adding a wanted signal at frequency −w, will give the same results for the IQ algorithm.

The image signal is also isolated from the rest of the spectrum by the corresponding frequency shifter 14 and filtering & decimating. The intermediate frequency analogue to digital converter output around w from Eq. 1 is frequency shifted by −w to 0 Hz:

$$Image_{BB}=IF_{ADC}*(\cos(-wt)+j*\sin(-wt))$$

Rewriting $Image_{BB}$ and eliminating the high frequency content which is filtered by filters 16 leads to:

$$Image_{BB\_LPF}=A*\cos(\tfrac{1}{2}\phi)+j*A*\tfrac{1}{2}*\sin(\tfrac{1}{2}\phi)$$

This signal equals the blocker signal 'A' when no IQ errors are present.

To obtain the IQ error by applying the technique of FIG. 1, the desired and image signal would need to be mixed back to their original locations −w and w respectively. The following formulae describe what will happen when the signals are mixed to an arbitrary frequency −r and r.

For the desired signal, this leads to:

$$Desired_{UP}=\Delta*A*\cos(\tfrac{1}{2}\phi)-j*A*\sin(\tfrac{1}{2}\phi)*(\cos(-rt)+j*\sin(-rt))$$

Rewriting this formula leads to:

$$Desired_{UP}=A*\Delta*(\cos(-rt)*\cos(\tfrac{1}{2}\phi))+j*\sin(-rt)\cos(\tfrac{1}{2}\phi)+A*\sin(-rt)*\sin((\tfrac{1}{2}\phi)-j*\cos(-rt)*\sin(\tfrac{1}{2}\phi)$$

For the image signal, this leads to:

$$Image_{UP}=A*\cos(\tfrac{1}{2}\phi)+j*A*\tfrac{1}{2}*\Delta*\sin(\tfrac{1}{2}\phi)*(\cos(rt)+j*\sin(rt))$$

Rewriting this formula leads to:

$$\text{Image}_{UP}=A*\cos(rt)*\cos(\phi/2)-A*\Delta*½*\sin(rt)*\sin(\phi/2)+j*A*(\sin(rt)*\cos(\phi/2)+\Delta*½*\cos(rt)*\sin(\phi/2))$$

Now that the desired signal is mixed to frequency −r, and the image to +r, they can be added together to obtain a signal (Total$_{UP}$) including the desired signal and the image:

$$\text{Total}_{UP}=A*\Delta*(\cos(-rt)*\cos(½\phi))+j*\sin(-rt)*\cos(½\phi)+A*\sin(-rt)*\sin(½\phi)j*\cos(-rt)*\sin(½\phi)+A*\cos(rt)*\cos(\phi/2)*\Delta*½*\sin(rt)*\sin(\phi/2)+j*A*(\sin(rt)*\cos(\phi/2)+\Delta*½*\cos(rt)*\sin(\phi/2))$$

This upmixing with frequencies −r and r and adding is part of the IQ coefficient estimation shown in FIG. 5. The amplitude and phase estimation part is then similar to the estimation in FIG. 2.

For the amplitude estimation, the absolute value of the Q branch is subtracted from the I branch. To simplify the formulas the following approximations are made:

$$\cos((\phi/2))\approx 1$$

$$\sin((\phi/2))\approx \phi/2$$

$$\cos(wt)\approx 2/\pi$$

$$\sin(wt)\approx 2/\pi$$

These are valid for small IQ errors and after averaging over many signal periods. The new obtained $D_{AVG\_NEW}$ equals:

$$D_{AVG\_NEW}\sim |A|*2/\pi*(2*\Delta-\Delta*\phi/2)$$

This is a proper measure for the amplitude mismatch Δ, as long as the phase mismatch ϕ is smaller than 4, which is the case.

For the phase indicator, the I branch and Q branch of the Total$_{UP}$ signal are multiplied. This, in combination with the above mentioned approximations leads to:

$$P_{AVG\_NEW}=-½*A^2*\phi*(1-½*\Delta^2)$$

This is a proper measure for the amplitude mismatch Δ, as long as the phase mismatch Δ is smaller than sqrt(2), which is the case. This shows that the exact frequency location for the reconstructed signal is not relevant for the algorithm to work.

Thus, the exact frequency location is not important, for that reason Fs/4 frequency mixers (Fs being the decimation filter output sampling rate) are introduced in FIG. 5. The desired IQ signals are mixed with a −Fs/4 mixer 62, and the image IQ signals are mixed with a Fs/4 mixer 64.

An Fs/4 mixer is extremely low in complexity since it mixes repeatedly by 1, j, −1 and −j. To enable this Fs/4 mixing, the desired and image signal after channel filtering must be oversampled by at least a factor of two. The reason is that there needs to be sufficient 'free room' in the frequency domain to place the desired signal at −Fs/4 and the image at +Fs/4.

After this frequency mixing, the positive frequency band of the desired signal and the negative frequency band of the image signal is clean, i.e. has zero value.

The two signals are added by adder 65. After adding, a reconstructed IQ signal is obtained, including the desired signal and its image. That signal is the input for the basic IQ coefficient estimator 24, identical to FIG. 2. For this reason, the same reference numerals are used as in FIG. 2 to denote the same components of the estimator 24.

The coefficient estimator of FIG. 2 focuses on the strongest signal in the band, cleaning the frequencies around −0.1 in the example given. The wanted channel might be around −0.3, which means the IQ correction is not optimal. By isolating the desired frequency band and the image band, and reconstructing a new signal Total$_{IP}$ as is achieved by the arrangement of FIG. 5 the original coefficient estimators can be used to correct for the IQ errors.

Figure 6:
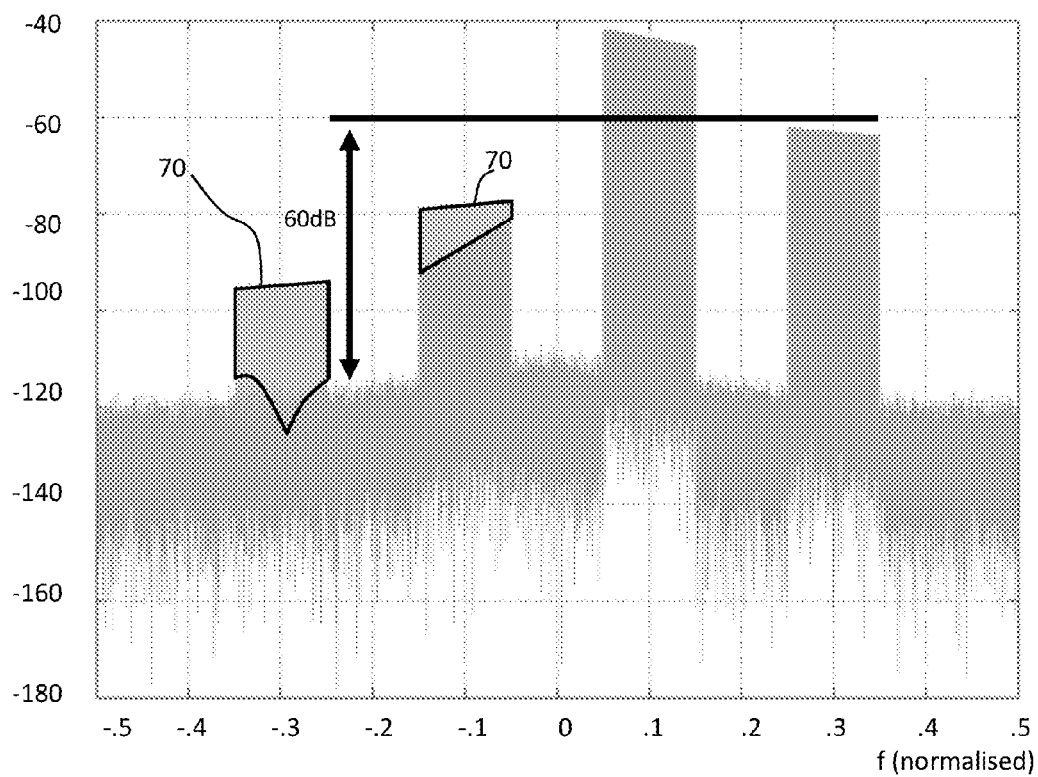
FIG. 6 shows the signal spectrum before and after compensation.

When the proposed algorithm is tuned to frequencies −0.3 (wanted) and 0.3 (image) it results in the compensated spectrum of FIG. 6.

Figure 3:
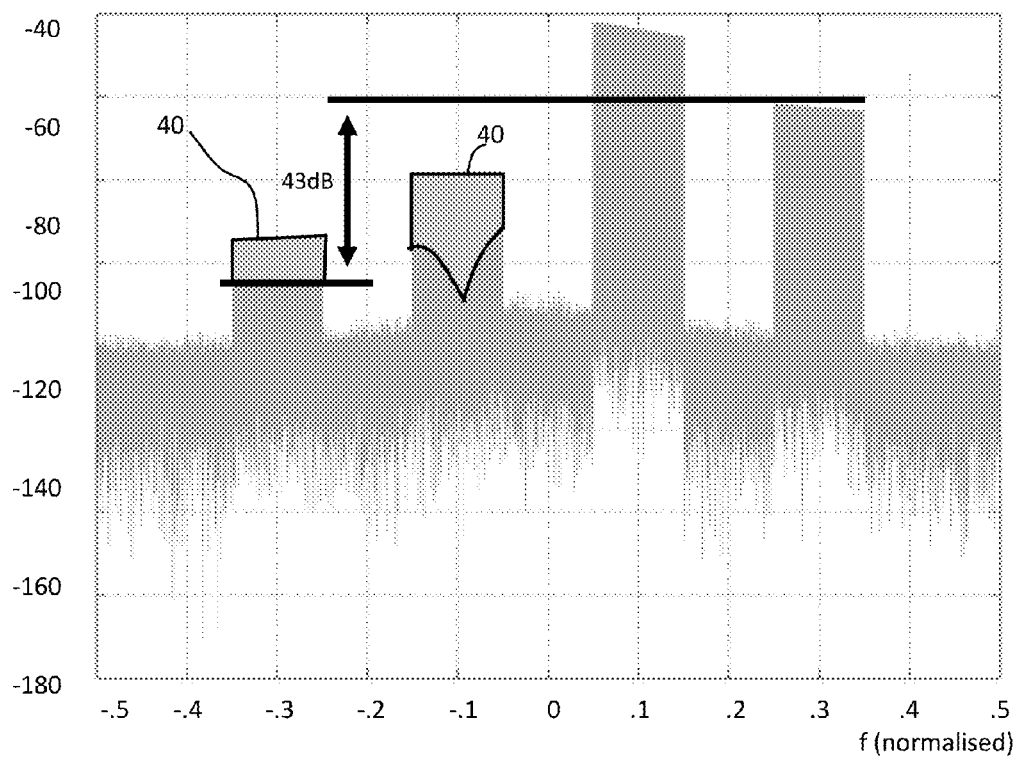
FIG. 3 shows the signal spectrum for the known approach before and after compensation.

In the same way as in FIG. 3, the plot shows the uncompensated spectrum, and the regions 70 show how the peaks are suppressed by the compensation.

The IR for this band is now 60 dB and limited by the noise floor of the system. The IR at −0.1 is much worse, but this is not the band of interest.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An RF receiver, comprising:
   a quadrature mixer which receives the RF input signal and which outputs in-phase and quadrature channels;
   analogue to digital converters for the in-phase and quadrature channels;
   an amplitude compensator for adjusting the amplitude of one or both of the channels to correct for amplitude mismatch, based on an amplitude correction coefficient;
   a phase compensator for adjusting the relative phase between the two channels to correct for phase mismatch, based on a phase correction coefficient;
   a first mixer generating in-phase and quadrature desired signals from the amplitude adjusted and phase adjusted channels by mixing with a first frequency, and a first digital channel filter at the output of the first mixer generating a filtered in-phase desired signal and a filtered quadrature desired signal;
   a second mixer generating in-phase and quadrature image signals from the amplitude adjusted and phase adjusted channels by mixing with a second frequency, and a second digital channel filter at the output of the second mixer generating a filtered in-phase image signal and a filtered quadrature image signal;
   a coefficient estimator for generating the phase correction coefficient and the amplitude correction coefficient from the filtered in-phase and quadrature desired signals and the filtered in-phase and quadrature image signals.

2. A receiver as claimed in claim 1, wherein the coefficient estimator comprises:
   a third mixer for mixing the filtered in-phase and quadrature desired signals with a third frequency to generate shifted in-phase and quadrature desired signals;

a fourth mixer for mixing the filtered in-phase and quadrature image signals with a fourth frequency which is the negative of the first frequency to generate shifted in-phase and quadrature image signals; and an adder for combining the shifted in-phase and quadrature signals to generate a combined in-phase signal and a combined quadrature signal.

3. A receiver as claimed in claim 2, wherein the fourth frequency is the analogue to digital converter sampling frequency divided by 4.

4. A receiver as claimed in claim 2, wherein the coefficient estimator further comprises:

an amplitude coefficient circuit for obtaining an amplitude difference between the combined in-phase signal and the combined quadrature signal.

5. A receiver as claimed in claim 4, wherein the amplitude coefficient circuit comprises an integrator for integrating the difference between samples of the combined in-phase signal and the combined quadrature signal.

6. A receiver as claimed in claim 2, wherein the coefficient estimator further comprises:

a phase coefficient circuit for obtaining a phase difference between the combined in-phase signal and the combined quadrature signal.

7. A receiver as claimed in claim 6, wherein the phase coefficient circuit comprises an integrator for integrating the correlation between samples of the combined in-phase signal and the combined quadrature signal.

8. A receiver as claimed in claim 1, wherein the amplitude compensator comprises a variable gain amplifier in series with one of the channels, controlled by the amplitude correction coefficient.

9. A receiver as claimed in claim 1, wherein the phase compensator comprises a variable gain amplifier and an adder, for adding an amplified component of one channel to the other channel, the variable gain amplifier of the phase compensator being controlled by the phase correction coefficient.

10. A receiver as claimed in claim 1, wherein the first and second digital channel filters have an output oversampled at least by a factor of 2.

11. A method for RF reception in an RF receiver, comprising:

a set of circuits within the RF receiver configured to,
perform quadrature mixing of a received RF input signal to generate in-phase and quadrature channels;
convert the in-phase and quadrature channels to digital;
adjust the amplitude of one or both of the channels to correct for amplitude mismatch, based on an amplitude correction coefficient;
adjust the relative phase between the two channels to correct for phase mismatch, based on a phase correction coefficient;
mix and channel filter the amplitude and phase adjusted channels to generate in-phase and quadrature desired signals, by mixing with a first frequency;
mix and channel filter the amplitude and phase adjusted channels to generate in-phase and quadrature image signals, by mixing with a second frequency; and
generate the phase correction coefficient and the amplitude correction coefficient from the filtered in-phase and quadrature desired signals and the filtered in-phase and quadrature image signals.

12. The method as claimed in claim 11, wherein the circuit for generating the phase correction coefficient and the amplitude correction coefficient further comprises a set of circuits configured to:

mix the filtered in-phase and quadrature desired signals with a third frequency to generate shifted in-phase and quadrature desired signals;
mix the filtered in-phase and quadrature image signals with a fourth frequency which is the negative of the first frequency to generate shifted in-phase and quadrature image signals;
combine the shifted in-phase and quadrature signals to generate a combined in-phase signal and a combined quadrature signal.

13. The method as claimed in claim 12, wherein the fourth frequency is the analogue to digital converter sampling frequency divided by 4.

14. The method as claimed in claim 12, wherein:

the circuit configured to generate the amplitude correction coefficient further comprises obtaining an amplitude difference between the combined in-phase signal and the combined quadrature signal by integrating the difference between samples of the combined in-phase signal and the combined quadrature signal; and the circuit configured to generate the phase correction coefficient further comprises obtaining a phase difference between the combined in-phase signal and the combined quadrature signal by integrating the correlation between samples of the combined in-phase signal and the combined quadrature signal.

* * * * *